United States Patent [19]
Kisanuki et al.

[11] Patent Number: 6,057,569
[45] Date of Patent: May 2, 2000

[54] DIODE LIMITER DEVICE

[75] Inventors: Ikuo Kisanuki; Manabu Tomita, both of Kamifukuoka, Japan

[73] Assignee: New Japan Radio Co., Ltd., Tokyo, Japan

[21] Appl. No.: 09/098,559

[22] Filed: Jun. 17, 1998

[30] Foreign Application Priority Data

Jul. 16, 1997 [JP] Japan ..................................... 9-207240

[51] Int. Cl.⁷ ................................................ H01L 29/80
[52] U.S. Cl. ........................... 257/275; 333/13; 333/17.2; 333/20; 333/65; 455/81; 455/217; 438/25; 438/27; 438/55; 257/458; 257/433; 257/434
[58] Field of Search .................................... 257/275, 458, 257/433, 434; 333/13, 20, 65, 17.2; 455/217, 81; 438/55, 25, 27

[56] References Cited

U.S. PATENT DOCUMENTS

| | | | |
|---|---|---|---|
| 4,673,896 | 6/1987 | Brady et al. | 333/13 |
| 4,875,022 | 10/1989 | Berry et al. | 333/20 |
| 5,128,636 | 7/1992 | Furutani et al. | 333/17.2 |

FOREIGN PATENT DOCUMENTS

| | | |
|---|---|---|
| 363206001 | 8/1988 | Japan . |
| 405067934 | 3/1993 | Japan . |
| 405136603 | 6/1993 | Japan . |
| 406216685 | 8/1994 | Japan . |
| 6216685 | 8/1994 | Japan . |
| 2202683 | 9/1988 | United Kingdom . |

OTHER PUBLICATIONS

V.J. Higgins et al., "Semiconductor Limiters and Microwave Duplexing Device", *Microwave Journal*, vol. 9, pp. 47–55 (Apr. 1966).

*Primary Examiner*—William Mintel
*Attorney, Agent, or Firm*—Armstrong, Westerman, Hattori, McLeland & Naughton

[57] ABSTRACT

The present invention provides a diode limiter device in which a first penetration hole is formed on a wall surface of an H surface; the PIN diode is supported by the PIN diode mounting side of the post with the PIN diode being electrically connected to the waveguide at the first penetration hole; a second penetration hole is formed on the other wall surface opposite to the wall surface; a second conductive boss which grasps the PIN diode with the post is electrically insulated and supported with respect to the second penetration hole; a wiring substrate with the detection diode and the resistor mounted thereon is installed; and the wiring substrate is supported in the second penetration hole by a third boss, thereby improving productivity and reducing cost.

4 Claims, 4 Drawing Sheets

DIODE LIMITER DEVICE

BACKGROUND OF THE INVENTION

The present invention relates to a diode limiter device for reflecting and attenuating microwaves propagated in a waveguide.

For example, in a receiving circuit of a radar device, a diode limiter device is disposed at a waveguide portion located between the receiving circuit and an oscillator in order to reflect and attenuate microwaves so that the microwaves of large power pulse-oscillated by the oscillator can be prevented from being introduced and receiving circuit can be prevented from damaging.

For a conventional diode limiter device of this kind, a PIN diode is used. Because the PIN diode is destroyed when the power of microwaves handled increases and the pulse width increases, a separately excited bias system in which an SBD (Schottky-barrier diode) is combined with microwaves and the detection current obtained with the SBD is used is employed for the bias of the PIN diode to improve handling power (max. rating) capabilities.

FIG. 5 shows a constitution of a conventional diode limiter device, and FIG. 6 an equivalent circuit. In this configuration, SBD 53 is fixed to an inner wall surface of a waveguide passage 51a of a waveguide 51 by an SBD post 52 equipped with a microwave choke in such a manner to penetrate H surface (magnetic field surface) of the waveguide 51. When the SBD 53 is combined with microwaves inside the waveguide 51 and the detection current flows the diode, the current is converted into detection voltage by a resistor 55 for serving as both load resistor connected between a top end of the SBD post 52 and the waveguide 51 and recovery time adjuster. The SBD post 52 is fixed to the waveguide 51 via an insulator 54.

A PIN post 57 for supporting a PIN diode 56 penetrates a screw 58 equipped with a choke and is electrically connected to the top end of the SBD post 52. By this configuration, the detection voltage by the SBD 53 is applied to the PIN 56 as bias. The PIN post 57 and the screw 58 are insulated and separated via an insulator 59.

Under this constitution, rotation of the screw 58 adjusts a length of a coaxial line portion 60 composed of the PIN post 57 and the waveguide portion and is able to adjust passing characteristics of the diode limiter. Numeral 61 is a diode limiter portion on the second stage, and since the microwave power is greatly lowered in this portion, a self-bias system can be used for the PIN diode, and a separately exciting bias system by the SBD is not adopted.

FIG. 7 shows a constitution of another conventional diode limiter device and FIG. 8 an equivalent circuit. In this configuration, an end portion 73a of a PIN post 73 which supports a PIN diode 72 is formed to be thick, where a spot facing 73b is formed, and in the spot facing 73b SBD 74 and one end of the resistor 75 for serving as both load resistor and recovery time adjuster are soldered. The PIN post 73 is fixed in such a manner that it is pressed by an insulation cylinder 76 and a screw 77, and the SBD 74 and the other end of the resistor 75 are soldered with a penetration hole 77a provided at the center of the screw 77, to achieve continuity with the waveguide 71. Numeral 78 is a diode limiter portion at the second stage, which has a constitution similar to that described above.

However, because with the diode limiter device shown in FIG. 5 and FIG. 6, the constitution for arranging the SBD 53 becomes complicated, there is a problem that poor productivity and high cost result. Since the SBD 53 is located in front of the PIN diode 56, the waveguide 51 must be elongated.

Because with the diode limiter device shown in FIG. 7 and FIG. 8, the SBD 74 and the resistor 75 are arranged three-dimensionally, there is a problem that poor productivity and high cost result as in the case of the diode limiter device shown in FIG. 5 and FIG. 6. In addition, there is also a problem that the adjusting function for variations in electrostatic capacity of the PIN diode 72 is unable to be provided because the length of the coaxial line formed with the PIN post 73 and the waveguide 71 is fixed.

In view of the foregoing, it is an object of the invention to provide a diode limiter device which can achieve good productivity and low cost.

SUMMARY OF THE INVENTION

In accordance with a first invention there is provided a diode limiter device which is designed to locate a conductive post in a direction crossing at right angles with respect to a microwave propagating direction of a waveguide passage of a waveguide, to mount a PIN diode on the post, and to bias the PIN diode by detection current obtained by connecting a detection diode connected to a resistor in parallel to the microwave, in which a first penetration hole is formed on a wall surface of an H surface of the waveguide; the PIN diode is supported by the PIN diode mounting side of the post with the PIN diode being electrically connected to the waveguide at the first penetration hole; a second penetration hole is formed on the other wall surface opposite to the wall surface; a second conductive boss which grasps the PIN diode with the post is electrically insulated and supported with respect to the second penetration hole; a wiring substrate with the detection diode and the resistor mounted thereon is installed; and the wiring substrate is supported in the second penetration hole by a third boss in such a manner that one common connecting portion composed of both one end of the detection diode and one end of the resistor on the wiring substrate is electrically connected to the second boss and the other common connecting portion composed of both the other end of the detection diode and the other end of the resistor is electrically connected to the waveguide via the conductive third boss.

The second invention is configured by supporting the post with respect to the first penetration hole by screwing the conductive first boss in the first penetration hole and by screwing the post in the first boss in the first invention.

The third invention is intended to form the second penetration hole with the opening on the waveguide passage side being reduced as well as with a spot facing having an increased depth being equipped, to support the second boss from the opening to the spot facing via an insulator, and to form a constriction at a barrel of the boss in the first or the second invention.

The fourth invention is intended to form a spot facing for locating the detection diode and the resistor of the wiring substrate at the third boss in the first and the second invention.

DETAILED DESCRIPTION

Figure 1:
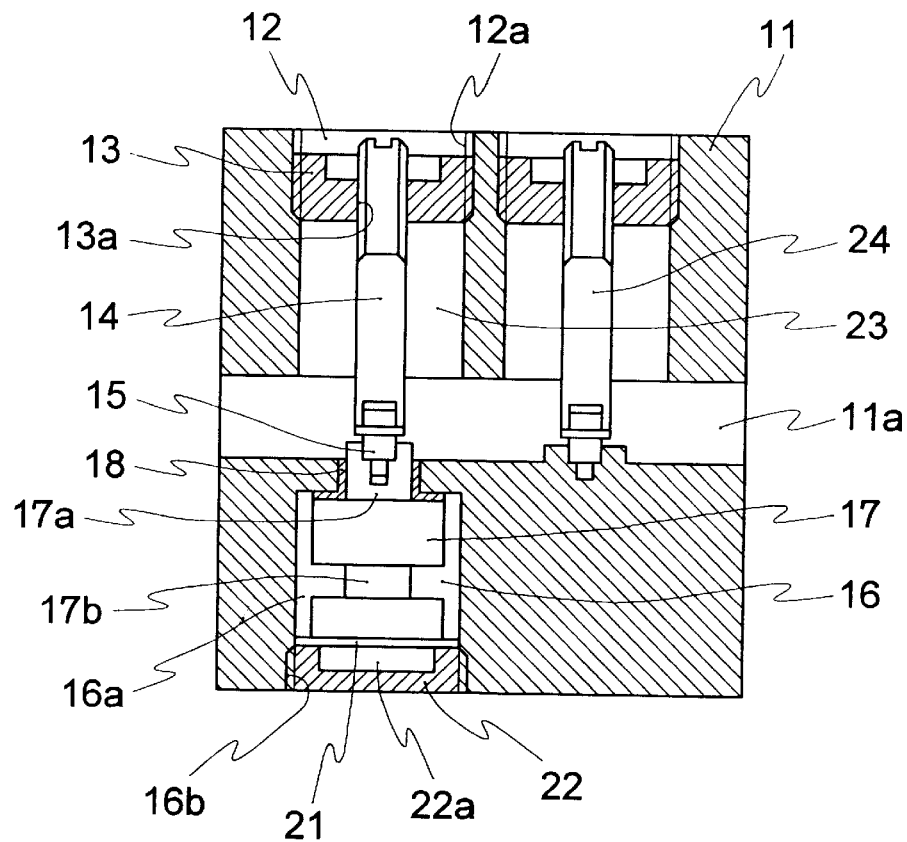
FIG. 1 is a cross-sectional view showing a constitution of a diode limiter device according to an embodiment of the present invention.
Figure 2:
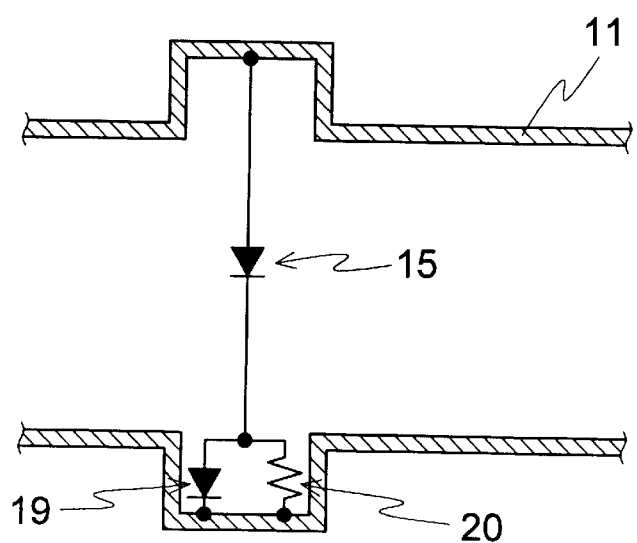
FIG. 2 is an equivalent circuit of the diode limiter device.

FIG. 1 shows a constitution of a diode limiter device according to an embodiment of the present invention, and FIG. 2 an equivalent circuit thereof. Numeral 11 is a waveguide having a waveguide passage 11a, on the H surface of which a first penetration hole 12 having a female thread portion 12a is provided. To the female thread portion 12a, a conductive first boss 13 with a penetrating female thread 13a formed at the center thereof is arranged by screwing. To the penetrating female thread 13a of this first boss 13, a conductive PIN post 14 is supported by screwing, and to the top end (bottom end) of the PIN post 14, a PIN diode 15 is arranged.

On an H surface opposite to the H surface, a second penetration hole 16 having a spot facing 16a is formed, and on the opening side of the spot facing 16a, a female thread portion 16b is formed. A conductive second boss 17 with a seating 17a for the PIN diode 15 is arranged with the periphery insulated by an insulator 18 (polypropylene) with respect to the waveguide 11. The PIN diode 15 is sandwiched between the seating 17a of the second boss 17 and the PIN post 14 and electrically connected to the seating 17a and PIN post 14. Numeral 17b is a constriction formed around a barrel of the second boss 17. On the side opposite to the seating 17a of the second boss 17, an insulating wiring substrate 21 with the SBD diode 19 and resistor 20 for serving as both load resistor and recovery time adjuster being surface-mounted while connected in parallel is installed by screwing a conductive third boss 22.

Figure 3:
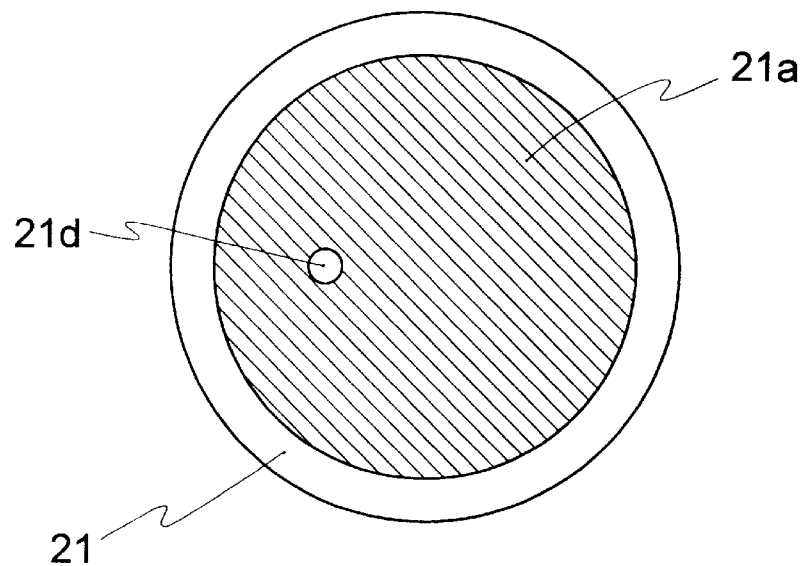
FIG. 3 is a top view showing a wiring substrate of the diode limiter device.
Figure 4:
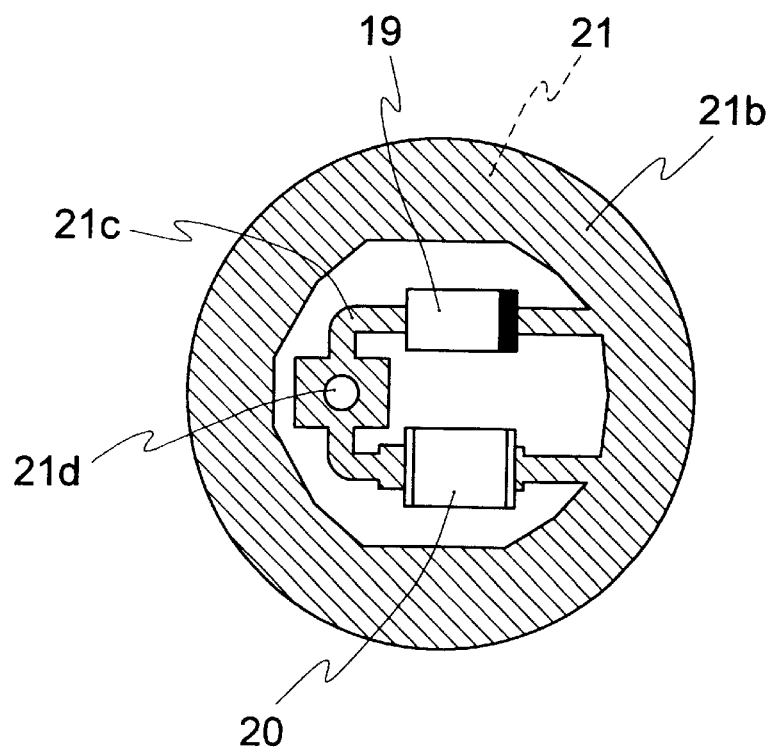
FIG. 4 is a bottom view showing the wiring substrate of the diode limiter device.
Figure 5:
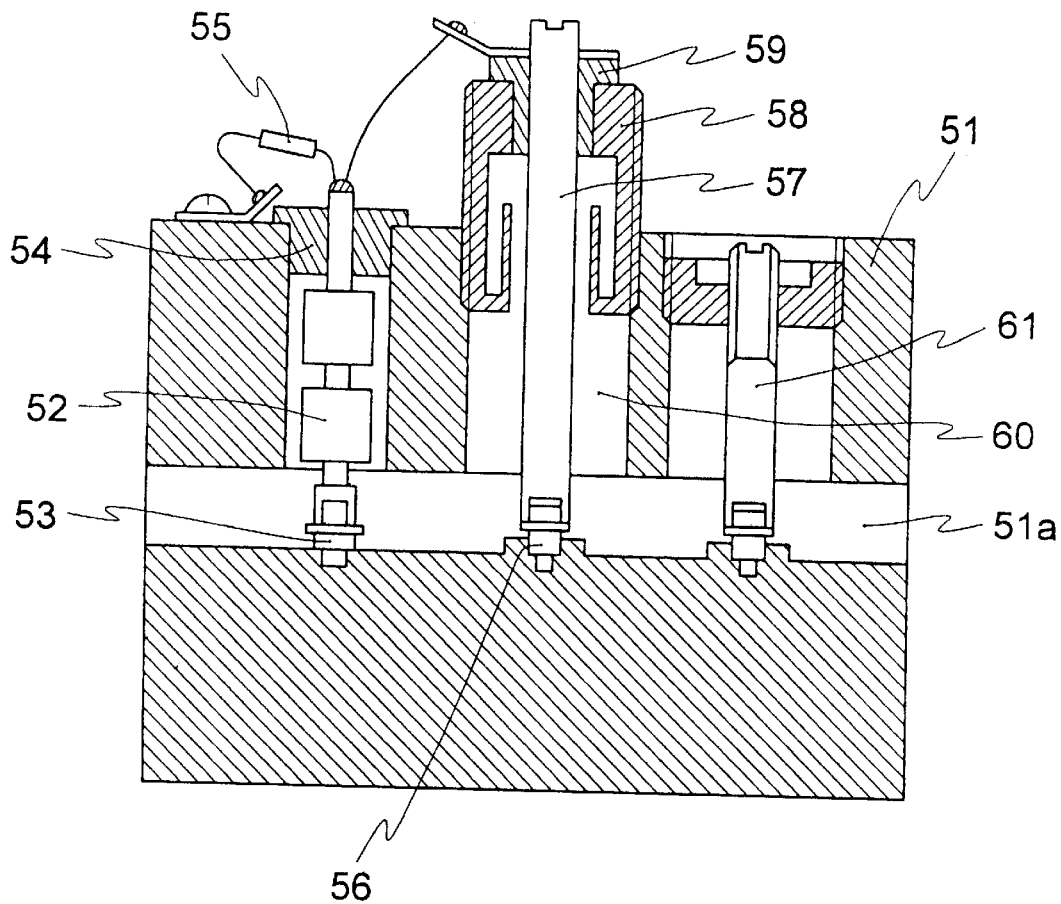
FIG. 5 is a cross-sectional view showing a constitution of a conventional diode limiter device.
Figure 6:
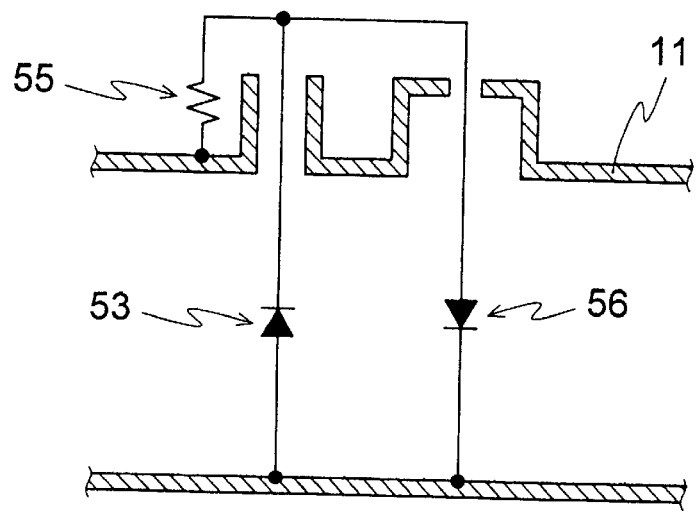
FIG. 6 is an equivalent circuit of the conventional diode limiter device.
Figure 7:
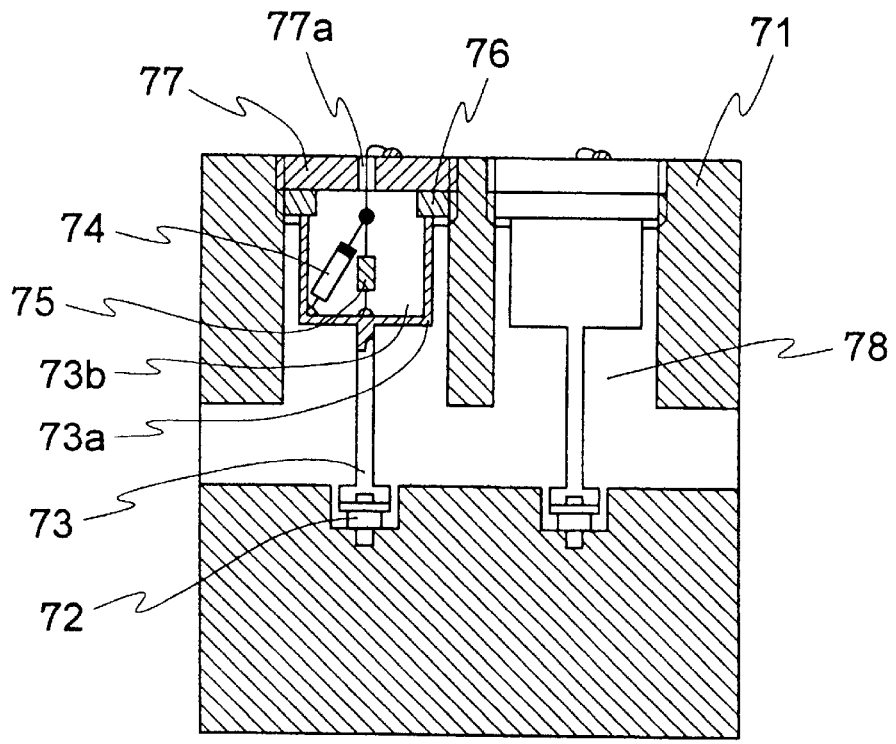
FIG. 7 is a cross-sectional view showing a constitution of another conventional diode limiter device.
Figure 8:
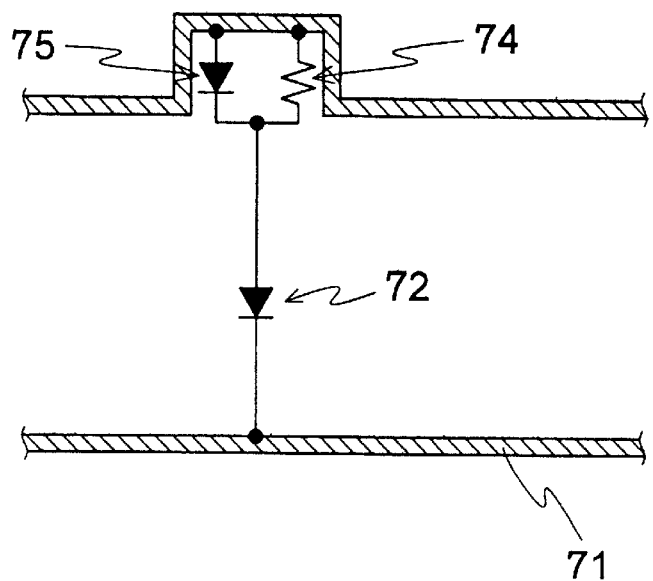
FIG. 8 is an equivalent circuit of another conventional diode limiter device.

The top pattern of the wiring substrate 21 is shown in FIG. 3 and the bottom pattern in FIG. 4. On the top surface of the wiring substrate 21, a conductive pattern 21a is formed with the pattern on the periphery being removed to enable contact with the second boss 17 but to prevent contact with the second penetration hole 16. On the bottom surface, there are formed a conductive pattern 21b developed to the periphery so that one end of the SBD 19 and one end of the resistor 20 are connected in common and at the same time, the third boss with a spot facing 22a formed is allowed to come in contact; and a conductive pattern 21c to which the other end of the SBD 19 and the other end of the resistor 20 are connected in common. The conductive pattern 21a on the top surface is electrically connected to the bottom surface conductive pattern 21c via a through hole 21d.

Consequently, screwing the third boss 22 in such a manner that the spot facing 22a surrounds the SBD 19 and the resistor 20 after inserting the wiring substrate 21 in such a manner that the top surface conductive pattern 21a comes electrically in contact with the second boss 17 electrically connect the bottom surface conductive pattern 21b to the waveguide 11 via the third boss 22. In this way, the equivalent circuit as shown in FIG. 2 is realized.

Numeral 24 is a diode limiter portion at the second stage where the microwave power is attenuated, so that the PIN diode is mounted by a self-bias system and no SBD is used. Since the diode limiter portion is not related to the invention, detailed description thereof will be omitted.

In the diode limiter device according to this embodiment, connection of the SBD 19 to the microwave is carried out by introducing microwave into the spot facing 16a from the insulator 18 of the clearance between the waveguide 11 and the second boss 17 and further passing the wiring substrate 21 and the spot facing 22a of the third boss 22. In this event, the microwave works on the SBD 19 after it is considerably attenuated by the insulator 18, the choke by the constriction 17b formed at the barrel 17b of the second boss 17, and the wiring substrate 21. The microwave power which is finally connected to the SBD becomes lower than breakdown power of the SBD. The detection current generated in the SBD 19 as a result of the microwave that has worked on the SBD is converted into voltage at the resistor 20 and is applied to the PIN diode 15 as bias voltage. This resistor 20 discharges electric charges accumulated while SBD diode 19 or PIN diode 15 are operating (microwave has pulse waveform) and serves to advance recovery time (time for the diode limiter passing characteristics to return to the original state).

Since the length of the coaxial line 23 formed with the PIN post 14 and the first penetration hole 12 can be adjusted by adjusting the screwing depth of the first boss 13, it is possible to adjust the limiter passing characteristics generated by scattering in electrostatic capacity of the PIN diode 15.

The SBD 19 shown in the above description is only one example and the diode is not limited to this but might be any detection diode if it works with the microwave and generates detection current, and might be used in place of the SBD. The second penetration hole 16 is not always necessary to be formed with a spot facing 16a, but might be formed into an ordinary penetration hole and configured to support the second boss 17 under the insulated condition.

According to the first invention, since the PIN diode is supported with the post conductively supported to the first penetration hole and the second boss insulatingly supported in the second penetration hole, and a wiring substrate with the detection diode and the resistor mounted thereon is arranged in the second penetration hole, the first and the second penetration holes can be coaxially arranged. Consequently, it is possible to shorten the length of the longitudinal direction of the waveguide passage as well as to simplify the constitution, whereby it is possible to improve productivity and reduce costs.

According to the second invention, since it is possible to adjust the position of the first boss, the length of the coaxial line formed in the first penetration hole as well as the limiter passing characteristics generated by scattering in electrostatic capacity of the PIN diode can be adjusted According to the third invention, it is possible to supply microwaves to the detection diode after microwaves are attenuated by the second boss located at the stepped portion formed between the opening on the waveguide passage side of the second penetration hole and the spot facing and by the choke realized by the constriction of the second boss, and it is possible to take the surest countermeasures against breakage of the detection diode.

According to the fourth invention, it is not only possible to prevent the detection diode or resistor on the wiring substrate from coming in contact with the third boss but also possible to form a passage of microwaves working on the detection diode without providing a special space.

It should be understood that the appratus and methods which have been shown and described herein are illustrative of the invention and are not intended to be limitative thereof. Clearly, those skilled in the art may conceive of variations or modifications to the invention However, any such variations or modifications which falls within the purview of this description are intended to be included therein as well. The scope of the invention is limited only by the claims appended hereto.

What is claimed is:

1. A diode limiter device which is designed to locate a conductive post in a direction crossing at right angles with respect to a microwave propagating direction of a waveguide passage of a waveguide, to mount a PIN diode of the post, and to bias the PIN diode by detection current obtained by connecting a detection diode connected to a resistor in parallel to the microwave, wherein a first penetration hole is formed on a first wall surface of an H surface of the waveguide the post is supported at a first end in the first penetration hole and electronically connected to the first penetration hole; the PIN diode is supported by a second end of the post with the PIN diode being electrically connected to the waveguide at the first penetration hole; a second penetration hole is formed on a second wall surface opposite to the first wall surface; a second conductive boss is electrically insulated and supported with respect to the second penetration hole the PIN diode is grasped between the second end of the post and the second boss; a wiring substrate with the detection diode and the resistor mounted thereon is installed; and the wiring substrate is supported in the second penetration hole between the second boss and a third boss in such a manner that one common connecting portion composed of both one end of the detection diode and one end of the resistor on a wiring pattern on one surface of the wiring substrate facing the wiring substrate is electrically connected to the second boss and the other common connecting portion composed of both the other end of the detection diode and the other end of the resistor is electrically connected to a wiring pattern on another surface of the wiring substrate facing the third boss which is supported by and electrically connected to the second penetration hole of the waveguide.

2. The diode limitter device of claim 1, wherein the post is supported with respect to the first penetration hole by screwing the conductive first boss in the first penetration hole and by screwing the post in the first boss.

3. The diode limitter device of claims 1 or 2, wherein the second penetration hole with the opening on the waveguide passage side is formed with a spot facing having an increased depth being equipped, to support the second boss from the opening to the spot facing via an insulator, and a constriction is formed at a barrel of the boss.

4. The diode limitter device of any one of claims 1 to 2, wherein a spot facing for locating the detection diode and the resistor of the wiring substrate is formed at the third boss.

* * * * *